(12) United States Patent
Tamura et al.

(10) Patent No.: US 12,701,833 B2
(45) Date of Patent: Aug. 4, 2026

(54) PLANAR LIGHT-EMITTING DEVICE

(71) Applicant: NICHIA CORPORATION, Anan (JP)

(72) Inventors: Takeshi Tamura, Tokushima (JP); Yuichi Hirao, Tokushima (JP)

(73) Assignee: NICHIA CORPORATION, Anan (JP)

( * ) Notice: Subject to any disclaimer, the term of this patent is extended or adjusted under 35 U.S.C. 154(b) by 314 days.

(21) Appl. No.: 18/454,066

(22) Filed: Aug. 23, 2023

(65) Prior Publication Data

US 2024/0072220 A1 Feb. 29, 2024

(30) Foreign Application Priority Data

Aug. 30, 2022 (JP) .................................. 2022-136734
Apr. 25, 2023 (JP) .................................. 2023-071733

(51) Int. Cl.
| | |
|---|---|
| *H10H 20/851* | (2025.01) |
| *F21V 9/30* | (2018.01) |
| *F21Y 105/16* | (2016.01) |
| *F21Y 113/13* | (2016.01) |
| *H10H 20/855* | (2025.01) |
| *H10H 29/14* | (2025.01) |
| *H10W 90/00* | (2026.01) |

(52) U.S. Cl.
CPC ........... *H10H 20/8515* (2025.01); *F21V 9/30* (2018.02); *H10H 20/8513* (2025.01); *H10H 20/8514* (2025.01); *H10H 29/142* (2025.01); *H10W 90/00* (2026.01); *F21Y 2105/16* (2016.08); *F21Y 2113/13* (2016.08); *H10H 20/855* (2025.01)

(58) Field of Classification Search
CPC ..... F21V 9/30; F21Y 2105/16; H10H 20/855; H10H 20/8513; H10H 29/142
See application file for complete search history.

(56) References Cited

U.S. PATENT DOCUMENTS

| | | | |
|---|---|---|---|
| 2014/0049155 A1* | 2/2014 | Kurtin | H10H 20/8513 |
| | | | 977/932 |
| 2017/0365225 A1 | 12/2017 | Yoneyama | |
| 2019/0027659 A1 | 1/2019 | Yamada | |

(Continued)

FOREIGN PATENT DOCUMENTS

| | | | | |
|---|---|---|---|---|
| CN | 108615742 A | * | 10/2018 | ......... H10H 20/8513 |
| CN | 113888991 A | * | 1/2022 | ............... G09F 9/33 |

(Continued)

*Primary Examiner* — Keith G. Delahoussaye
(74) *Attorney, Agent, or Firm* — MORI & WARD, LLP

(57) ABSTRACT

A planar light-emitting device includes a plurality of light-emitting elements arranged at same intervals in a planar configuration, and a wavelength conversion member located above the plurality of light-emitting elements. The plurality of light-emitting elements is configured to emit blue light. The wavelength conversion member contains a phosphor that emits light when being excited by light emitted from the light-emitting elements. The plurality of light-emitting elements includes a first light-emitting element located in an outer perimeter region in a plan view, and a second light-emitting element located in a central region in the plan view. The central region is positioned inward of the outer perimeter region in the plan view. A peak wavelength of light emitted from the first light-emitting element is less than a peak wavelength of light emitted from the second light-emitting element.

16 Claims, 4 Drawing Sheets

(56) References Cited

U.S. PATENT DOCUMENTS

| | | | |
|---|---|---|---|
| 2019/0063723 A1* | 2/2019 | Yamada | ............... H10H 20/841 |
| 2019/0309913 A1* | 10/2019 | Yamamoto | ............ F21V 3/0625 |
| 2021/0026203 A1 | 1/2021 | Kim et al. | |
| 2021/0165280 A1 | 6/2021 | Lee et al. | |
| 2021/0270443 A1* | 9/2021 | Yun | ........................... F21V 9/30 |

FOREIGN PATENT DOCUMENTS

| | | |
|---|---|---|
| JP | 2012-243653 | 12/2012 |
| JP | 2013-247038 | 12/2013 |
| JP | 2013-247039 | 12/2013 |
| JP | 2016-164853 | 9/2016 |
| JP | 2019-024071 | 2/2019 |
| JP | 2020-053364 | 4/2020 |
| JP | 2021-018991 | 2/2021 |

* cited by examiner

PLANAR LIGHT-EMITTING DEVICE

CROSS-REFERENCE TO RELATED APPLICATIONS

This application is based upon and claims the benefit of priority from Japanese Patent Application No. 2022-136734, filed on Aug. 30, 2022, and Japanese Patent Application No. 2023-071733, filed on Apr. 25, 2023; the entire contents of which are incorporated herein by reference.

BACKGROUND

Embodiments described herein relate generally to a planar light-emitting device.

A planar light-emitting device in which a plurality of light-emitting elements are arranged in a planar configuration is used as a backlight of an image display device. A direct-type backlight described in JP-A 2021-18991 (Kokai) is an example of a planar light-emitting device. Unevenness in emission color may occur in planar light-emitting devices. It is desirable to reduce the unevenness in emission color of planar light-emitting devices.

SUMMARY

It has been determined that there is a need to provide a planar light-emitting device in which unevenness in emission color can be reduced.

A planar light-emitting device according to an embodiment of the invention includes a plurality of light-emitting elements arranged at same intervals in a planar configuration, the plurality of light-emitting elements configured to emit blue light; and a wavelength conversion member located above the plurality of light-emitting elements, the wavelength conversion member containing a phosphor that emits light when being excited by light emitted from the plurality of light-emitting elements. The plurality of light-emitting elements include a first light-emitting element located in an outer perimeter region in a plan view, and a second light-emitting element located in a central region in the plan view, the central region being positioned inward of the outer perimeter region in the plan view. A peak wavelength of light emitted from the first light-emitting element is less than a peak wavelength of light emitted from the second light-emitting element.

According to embodiments of the present invention, a planar light-emitting device can be realized in which unevenness in emission color can be reduced.

DETAILED DESCRIPTION

First Embodiment

Figure 1:
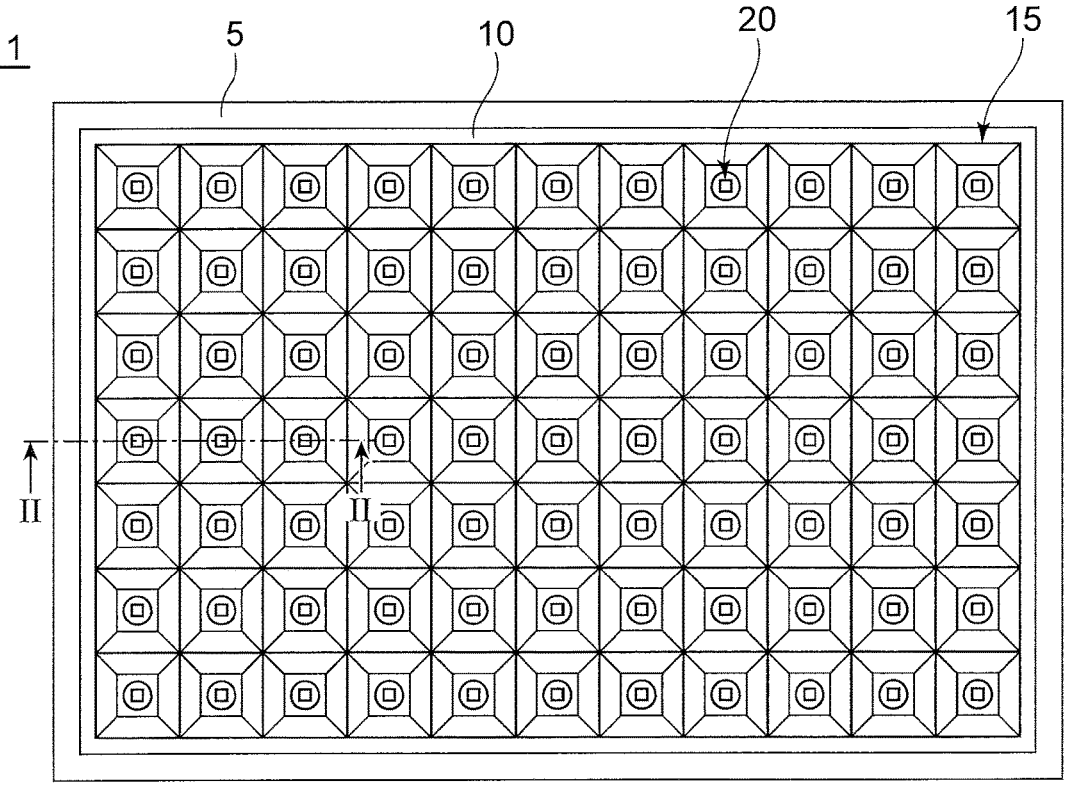
FIG. 1 is a plan view schematically showing a planar light-emitting device according to a first embodiment.

FIG. 1 is a plan view schematically showing a planar light-emitting device according to a first embodiment.

Figure 2:
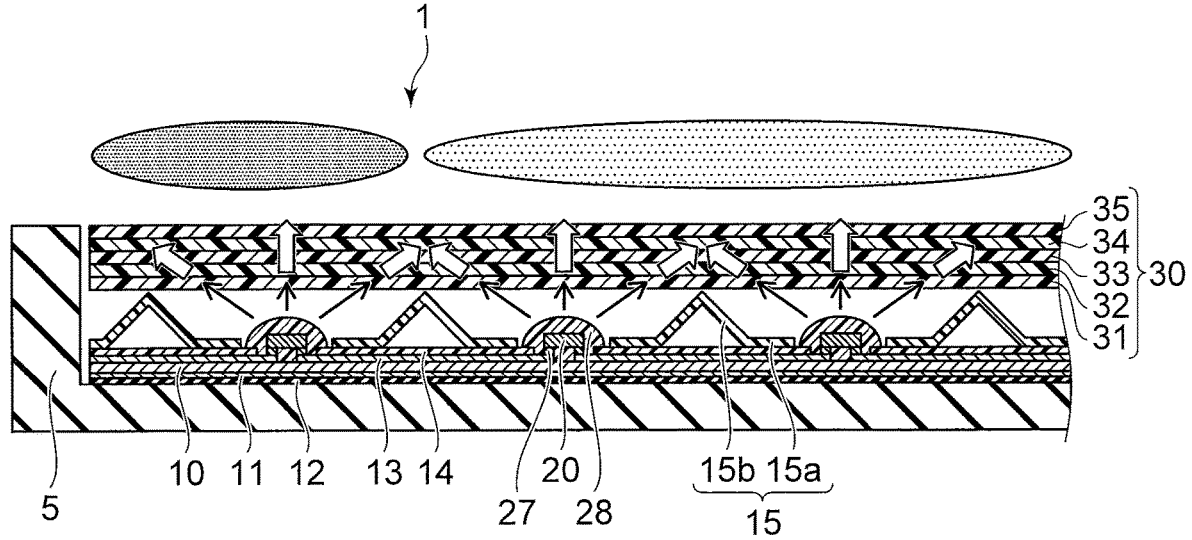
FIG. 2 is a cross-sectional view schematically showing a portion of the planar light-emitting device according to the first embodiment.

FIG. 2 is a cross-sectional view schematically showing a portion of the planar light-emitting device according to the first embodiment, and is a cross-sectional view along line II-II shown in FIG. 1.

As shown in FIGS. 1 and 2, the planar light-emitting device 1 according to the first embodiment includes a substrate 10, a lower wiring part 11, a lower cover member 12, an upper wiring part 13, an upper cover member 14, a demarcation member 15, a plurality of light-emitting elements 20, a bonding member 27, a light-transmitting member 28, and an optical member 30 that includes a wavelength conversion member 32.

The planar light-emitting device 1 has a structure in which the plurality of light-emitting elements 20 are located on the substrate 10, and the optical member 30 is located on the plurality of light-emitting elements 20. For example, the planar light-emitting device 1 is housed inside a housing 5. The housing 5 is provided as necessary. The planar light-emitting device 1 does not necessarily include the substrate 10, the lower wiring part 11, the lower cover member 12, the upper wiring part 13, the upper cover member 14, the demarcation member 15, the bonding member 27, the light-transmitting member 28, and the optical member 30 other than the wavelength conversion member 32.

In the specification, the direction from the light-emitting element 20 toward the optical member 30 (the wavelength conversion member 32) is referred to as "upper", "upward", etc., and the opposite direction is called "downward", "lower", etc. However, these expressions are for convenience and are independent of the direction of gravity. In the specification, viewing along the vertical direction (upward-downward direction) is called "in a plan view". In the specification, a direction perpendicular to the vertical direction is called the "horizontal direction".

The substrate 10 is a circuit board to which the plurality of light-emitting elements 20 are mounted. The substrate 10 has a plate shape extending horizontally. For example, a ceramic, a resin, and a composite material are examples of the material of the substrate 10.

The lower wiring part 11 is located under the substrate 10. The lower wiring part 11 is located along the lower surface of the substrate 10. For example, the lower wiring part 11 is in a layer shape extending horizontally. For example, conductors such as metals, etc., are examples of the material of the lower wiring part 11.

The lower cover member 12 is located under the lower wiring part 11. The lower cover member 12 covers at least a portion of the lower surface of the lower wiring part 11. For example, the lower cover member 12 is in a layer shape extending horizontally. For example, insulators such as resins, etc., are examples of the material of the lower cover member 12. For example, the lower cover member 12 is formed of a white solder resist. The lower wiring part 11 and the lower cover member 12 are omissible.

The upper wiring part 13 is located on the substrate 10. The upper wiring part 13 is located at the upper surface of the substrate 10 and covers a portion of the upper surface of the substrate 10. For example, the upper wiring part 13 is provided in a layer shape extending horizontally. For example, conductors such as metals, etc., are examples of the material of the upper wiring part 13.

The upper cover member 14 is located on the upper wiring part 13. The upper cover member 14 is located along the upper surface of the upper wiring part 13 and covers a portion of the upper surface of the upper wiring part 13. A portion of the upper wiring part 13 is not covered with the upper cover member 14 and is exposed upward. For example, the upper cover member 14 is provided in a layer shape extending horizontally. Insulators such as resins, etc., are examples of the material of the upper cover member 14.

The light-reflective demarcation member 15 is located on the upper cover member 14 and includes a plurality of regions each surrounding a corresponding one of the light-emitting elements. The demarcation member 15 includes a top part located in a lattice shape in a plan view, a wall part 15*b* that is continuous with the top part and surrounds each of the light-emitting elements in a plan view, and a bottom part 15*a* connected with the lower end of the wall part 15*b*. The demarcation member 15 does not necessarily include the bottom part 15*a*. The regions surrounded with the wall part 15*b* will be referred to as demarcated regions. The demarcation member 15 defines a plurality of demarcated regions. Each demarcated region is provided to surround at least one of the plurality of light-emitting elements 20 on the substrate 10. In the example, each demarcated region is provided to surround a single light-emitting element 20.

It is preferable for the demarcation member 15 to be light-reflective. For example, the light-reflective demarcation member 15 is molded using a resin that includes a reflective material made of metal oxide particles of titanium oxide, aluminum oxide, silicon oxide, etc. The light-reflective demarcation member 15 can be formed by molding a resin not including a reflective material, and then providing a reflective material at a surface of the molded resin. By providing the light-reflective demarcation member 15, the light that is emitted from the light-emitting element 20 can be efficiently reflected upward by the demarcation member 15.

The plurality of light-emitting elements 20 are located on the upper wiring part 13. The plurality of light-emitting elements 20 are located on the upper wiring part 13 with the bonding member 27 disposed therebetween. The plurality of light-emitting elements 20 are located on the substrate 10 where the upper wiring part 13 is located with the bonding member 27 disposed therebetween. For example, conductors such as metals, etc., are examples of the material of the bonding member 27. For example, electrical power is supplied to the light-emitting elements 20 from the substrate 10 via the upper wiring part 13 and the bonding member 27.

The plurality of light-emitting elements 20 are located on the substrate 10. The arrangement of the plurality of light-emitting elements 20 is described below.

The light-emitting element 20 is, for example, an LED (Light-Emitting Diode). The light-emitting element 20 emits blue light. The light-emitting element 20 includes a semiconductor stacked body. The semiconductor stacked body includes an n-type semiconductor layer, a p-type semiconductor layer, and a light-emitting layer disposed between the n-type semiconductor layer and the p-type semiconductor layer. The light-emitting layer can have a structure such as a double heterojunction, a single quantum well (SQW), etc., or a structure having a group of active layers such as a multi-quantum well (MQW). The semiconductor stacked body can include a plurality of light-emitting layers. For example, the semiconductor stacked body can have a configuration including two or more light-emitting layers between an n-type semiconductor layer and a p-type semiconductor layer, or a configuration in which a structure that includes an n-type semiconductor layer, a light-emitting layer, and a p-type semiconductor layer in this order is repeated a plurality of times. When the semiconductor stacked body includes a plurality of light-emitting layers, the light emission peak wavelengths can be different between the plurality of light-emitting layers, or light-emitting layers that have the same light emission peak wavelength can be included in the semiconductor stacked body.

For example, a nitride semiconductor such as GaN, InGaN, AlGaN, AlInGaN, etc., can be used as the light-emitting element 20.

The peak wavelength of the light emitted by the light-emitting element 20 is, for example, not less than 430 nm and not more than 460 nm, and favorably not less than 440 nm and not more than 460 nm. As described below, for example, the plurality of light-emitting elements 20 include a plurality of types of light-emitting elements having different peak wavelengths. As shown in FIG. 2, in one example, the light-emitting element 20 is flip-chip mounted via the bonding member 27 over a corresponding pair of positive and negative upper wiring parts 13 located at the upper surface of the substrate 10. However, the light-emitting element 20 is not limited to flip-chip mounted and can be face-up mounted. The light-emitting element 20 can include a light-reflecting film at the upper surface thereof. A metal film of silver, copper, or the like, a component in which a white-based filler or the like is contained in a resin, a dielectric multilayer film (DBR), etc., are examples of the light-reflecting film. A light-emitting device that includes a light-emitting element and a resin or the like, can be used instead of the light-emitting element.

The light-transmitting member 28 covers at least one of the plurality of light-emitting elements 20 on the substrate 10. The light-transmitting member 28 covers the light-emitting element 20 to protect the light-emitting element 20 from the external environment, to optically control the light emitted from the light-emitting element 20 (e.g., to obtain a batwing light distribution characteristic), etc. A light-transmitting resin such as an epoxy resin, a silicone resin, a mixed resin of an epoxy resin and a silicone resin, glass, etc., can be used as the material of the light-transmitting member 28. Considering light resistance and ease of molding, among these substances, it is favorable to use a silicone resin. The light-transmitting member 28 can include a diffusing agent for diffusing the light from the light-emitting element 20, a colorant corresponding to the light emission color of the light-emitting element 20, etc. Diffusing agents, colorants, etc., that are known in this field can be used. In the example, a single light-transmitting member 28 covers a single light-emitting element 20. A single light-transmitting member 28 can cover two or more light-emitting elements 20. A portion of the light-transmitting member 28 can be positioned between the light-emitting element 20 and the substrate 10.

The optical member 30 is located above the plurality of light-emitting elements 20. The optical member 30 includes, for example, a diffusion plate 31, the wavelength conversion member 32, a first prism sheet 33, a second prism sheet 34, and a polarized sheet 35. For example, the diffusion plate 31, the wavelength conversion member 32, the first prism sheet 33, the second prism sheet 34, and the polarized sheet 35 have plate shapes extending horizontally. The diffusion plate 31, the first prism sheet 33, the second prism sheet 34, and the polarized sheet 35 are provided as necessary and are omissible. That is, it is sufficient for the optical member 30 to include at least the wavelength conversion member 32.

For example, the diffusion plate 31 is positioned at the lower portion of the optical member 30. The diffusion plate 31 diffuses and transmits the incident light. The uniformity of the light can be increased by providing the diffusion plate 31. For example, a material that has low optical absorption for visible light such as a polycarbonate resin, a polystyrene resin, an acrylic resin, a polyethylene resin, etc., are examples of the material of the diffusion plate 31. The diffusion plate 31 can be positioned on the wavelength conversion member 32 elaborated below.

The wavelength conversion member 32 is positioned on the diffusion plate 31. The wavelength conversion member 32 is located above the plurality of light-emitting elements 20. The wavelength conversion member 32 and the plurality of light-emitting elements 20 are separated from each other. For example, the wavelength conversion member 32 and the plurality of light-emitting elements 20 can be separated from each other by providing the top part of the wall part 15b of the demarcation member 15 in contact with the wavelength conversion member 32 or the diffusion plate 31 located under the wavelength conversion member 32.

The wavelength conversion member 32 absorbs a portion of the blue light emitted from the light-emitting element and emits light that is different from blue, e.g., green light, red light, or yellow light. The wavelength conversion member 32 includes a phosphor that is excited by the blue light emitted from the light-emitting element 20 and emits light that is different from blue, e.g., green light, red light, or yellow light. The phosphor is described below.

The first prism sheet 33 is positioned on the wavelength conversion member 32. The first prism sheet 33 has a configuration in which a plurality of prisms extending in a predetermined direction are arranged at the surface of the first prism sheet 33. The first prism sheet 33 includes, for example, a plurality of prisms that are located in the xy plane and extend in the x-direction.

The second prism sheet 34 is positioned on the first prism sheet 33. The second prism sheet 34 has a configuration in which a plurality of prisms that extend in a predetermined direction are arranged at the surface of the second prism sheet 34. The second prism sheet 34 include, for example, a plurality of prisms that are located in the xy plane and extend in the y-direction.

The polarized sheet 35 is positioned on the second prism sheet 34. For example, the polarized sheet 35 selectively transmits light of a first polarization and reflects light of a second polarization oriented perpendicular to the first polarization. A portion of the light of the second polarization reflected by the polarized sheet 35 is re-reflected by the first prism sheet 33, the second prism sheet 34, the wavelength conversion member 32, and the diffusion plate 31. At this time, the polarization direction is changed; for example, the light of the second polarization is converted into light of the first polarization and is again incident on the polarized sheet 35. The polarization direction of the light emitted from the planar light-emitting device 1 can be aligned thereby, and light in a polarization direction effective for improving the luminance of the display panel can be emitted with high efficiency. For example, a sheet that is commercially available as an optical member for a backlight can be used as the polarized sheet 35.

Although the planar light-emitting device 1 that includes the substrate 10 is described in the example above, the substrate 10 is provided as necessary and is omissible. For example, a planar light-emitting device can be used in which the plurality of light-emitting elements 20 are held in one transmissive resin, etc.

The wavelength conversion member 32 will now be described in more detail.

Figure 3:
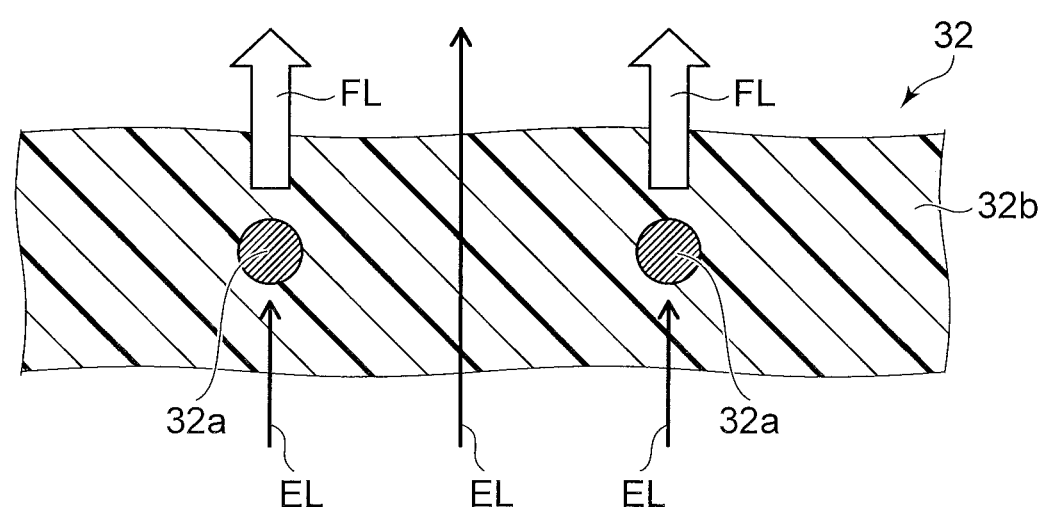
FIG. 3 is a cross-sectional view schematically showing a portion of the wavelength conversion member of the planar light-emitting device according to the first embodiment.

FIG. 3 is a cross-sectional view schematically showing a portion of the wavelength conversion member of the planar light-emitting device according to the first embodiment.

As shown in FIG. 3, the wavelength conversion member 32 includes a phosphor 32a and a base material 32b. For example, the base material 32b is made of a light-transmitting material. For example, the phosphor 32a is dispersed in the base material 32b.

The phosphor 32a is excited by light (excitation light EL) emitted from the light-emitting element 20 and emits light (fluorescence FL) that is different from the light emitted from the light-emitting element 20. The phosphor 32a includes, for example, a green phosphor that emits green light when being excited by the blue light from the light-emitting element 20, and a red phosphor that emits red light when being excited by the blue light from the light-emitting element 20.

The peak wavelength of the light emitted by the green phosphor is, for example, not less than 490 nm and not more than 570 nm, and favorably not less than 525 nm and not more than 549 nm. The green phosphor includes, for example, at least one selected from the group consisting of β-sialon (β-SiAlON ($(Si, Al)_3(O, N)_4$:Eu)), chlorosilicate ($Ca_8MgSi_4O_{16}Cl_2$:Eu), silicate, BSON ($Ba_3Si_6O_{12}N_2$:Eu), perovskite ($CsPb(F, Cl, Br, I)_3$), and thiogallate.

The peak wavelength of the light emitted by the red phosphor is, for example, not less than 600 nm and not more than 680 nm. The red phosphor includes, for example, at least one selected from the group consisting of KSF ($K_2SiF_6$:Mn), KSAF ($K_2Si_{0.99}Al_{0.01}F_{5.99}$:Mn), MGF ($3.5MgO·_{0.5}MgF_2·GeO_2$:Mn), SCASN ($(Sr, Ca)AlSiN_3$:Eu), CASN ($CaAlSiN_3$:Eu), and α-sialon ($Ca(Si, Al)_{12}(O, N)_{16}$:Eu).

When the phosphor 32a includes a green phosphor and a red phosphor, a portion of the blue light (the excitation light EL) emitted from the light-emitting element 20 is converted into green light (the fluorescence FL) by the green phosphor. Another portion of the blue light (the excitation light EL) emitted from the light-emitting element 20 is converted into red light (the fluorescence FL) by the red phosphor. Another portion of the blue light (the excitation light EL) emitted from the light-emitting element 20 passes through the wavelength conversion member 32 without being converted. White light is emitted from the wavelength conversion member 32 by the green light (the fluorescence FL), the red light (the fluorescence FL), and the blue light (the excitation light EL) mixing. Accordingly, the planar light-emitting device 1 that emits white light can be realized by using the light-emitting element 20 that emits blue light. The planar light-emitting device 1 that emits white light of the desired chromaticity can be realized.

Instead of a green phosphor and a red phosphor, the phosphor 32a can include, for example, a yellow phosphor that emits yellow light by being excited by the blue light from the light-emitting element 20. The peak wavelength of the light emitted by the yellow phosphor is, for example, not less than 540 nm and not more than 620 nm. The yellow phosphor includes, for example, at least one selected from the group consisting of YAG $(Y_3(Al, Ga)_5O_{12}:Ce)$ and SBSiON $((Sr, Ba, Ca) Si_2O_2N_2:Eu)$.

When the phosphor 32a includes a yellow phosphor, a portion of the blue light (the excitation light EL) emitted from the light-emitting element 20 is converted into yellow light (the fluorescence FL) by the yellow phosphor. Another portion of the blue light (the excitation light EL) emitted from the light-emitting element 20 passes through the wavelength conversion member 32 without being converted. White light is emitted from the wavelength conversion member 32 by the yellow light (the fluorescence FL) and the blue light (the excitation light EL) mixing. Accordingly, the planar light-emitting device 1 that emits white light can be realized by using the light-emitting element 20 that emits blue light.

The arrangement of the light-emitting elements 20 will now be described in more detail.

Figure 4:
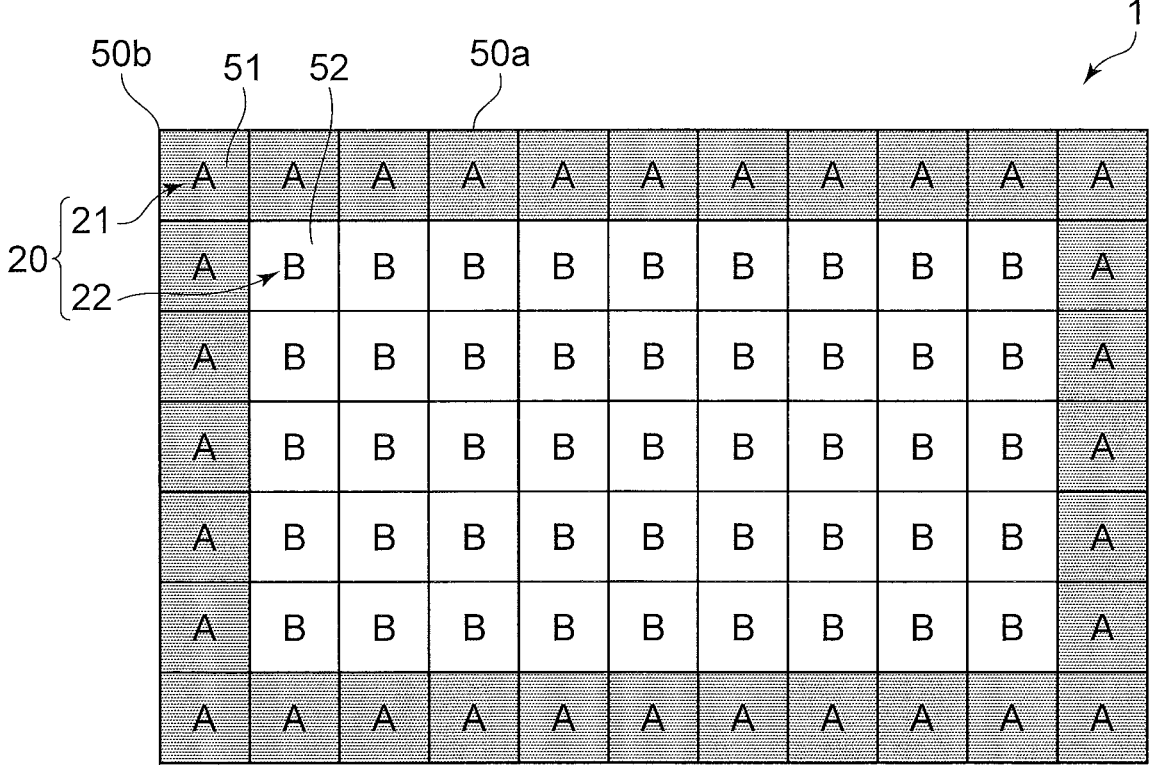
FIG. 4 is a plan view illustrating the arrangement of the light-emitting elements of the planar light-emitting device according to the first embodiment.

FIG. 4 is a plan view illustrating the arrangement of the light-emitting elements of the planar light-emitting device according to the first embodiment.

As shown in FIGS. 1 and 4, the plurality of light-emitting elements 20 are regularly arranged in a matrix configuration in a plan view. The plurality of light-emitting elements 20 are arranged at the same intervals in a planar configuration. Herein, one direction along the horizontal direction is taken as a first direction (e.g., the row direction of the matrix); and a direction orthogonal to the first direction along the horizontal direction is taken as a second direction (e.g., the column direction of the matrix). The distances (intervals) in the first direction between the plurality of light-emitting elements 20 arranged in the first direction are the same (constant). Also, the distances (intervals) in the second direction between the plurality of light-emitting elements 20 arranged in the second direction are the same (constant). The distances (intervals) in the first direction between the plurality of light-emitting elements 20 arranged in the first direction are equal to the distances (intervals) in the second direction between the plurality of light-emitting elements 20 arranged in the second direction.

In other words, as shown in FIGS. 1 and 4, the plurality of light-emitting elements 20 being arranged at the same intervals in a planar configuration means that the intervals are the same for any two light-emitting elements 20 located adjacent to each other in the first direction and/or the second direction. Also, no other light-emitting element for emitting light as a planar light-emitting device is disposed between any two adjacent light-emitting elements 20.

In this specification, the expression that the intervals are "the same" or "equal" means that the intervals are within ±10% of the average interval. The average interval is the average value of the intervals between respective two adjacent light-emitting elements 20 for all of the light-emitting elements included in the planar light-emitting device 1. It is favorable for not less than 90% of all of the light-emitting elements 20 included in the planar light-emitting device 1 to be arranged at the same intervals in the planar configuration. It is more favorable for not less than 95% of all of the light-emitting elements 20 included in the planar light-emitting device 1 to be arranged at the same intervals in the planar configuration. It is more favorable for all (100%) of the light-emitting elements 20 included in the planar light-emitting device 1 to be arranged at the same intervals in the planar configuration.

The plurality of light-emitting elements 20 include a first light-emitting element 21 located in an outer perimeter region 51, and a second light-emitting element 22 located in a central region 52 positioned further inward of the outer perimeter region 51. Each of the outer perimeter region 51 and the central region 52 includes a plurality of light-emitting regions, in each of which the light-emitting element 20 is located at a center of the light-emitting region. For example, the outer perimeter region 51 and the central region 52 shown in FIG. 4 can be defined as the outer perimeter region 51 and the central region 52 of an element placement region, in which the plurality of light-emitting elements 20 are disposed, of the upper surface of the substrate 10. From another perspective, for example, the outer perimeter region 51 and the central region 52 shown in FIG. 4 can be defined as an outer perimeter region and a central region of the light-emitting surface of the planar light-emitting device 1. The outer perimeter region 51 is shown by cross hatching in FIG. 4. The outer perimeter region 51 is positioned at the outermost perimeter of the element placement region. The outer perimeter region 51 is the outermost region that has outer perimeter edges 50a. The outer perimeter region 51 has corners 50b. The central region 52 is positioned further inward of the outer perimeter region 51 in the element placement region in a plan view.

The plurality of light-emitting elements 20 include the first light-emitting element 21 and the second light-emitting element 22. In FIG. 4, the first light-emitting element 21 is indicated by "A"; and the second light-emitting element 22 is indicated by "B". The first light-emitting element 21 is located in the outer perimeter region 51. The second light-emitting element 22 is located in the central region 52. The first light-emitting element 21 can be referred to as an outer perimeter light-emitting element; and the second light-emitting element 22 can be referred to as a central light-emitting element.

The first light-emitting element 21 emits light that has a peak wavelength $\lambda 1$. The second light-emitting element 22 emits light that has a peak wavelength $\lambda 2$. The peak wavelength $\lambda 1$ is less than the peak wavelength $\lambda 2$. The peak wavelength $\lambda 1$ is favorably not less than 430 nm and not more than 460 nm, and more favorably not less than 440 nm and not more than 446 nm. The peak wavelength $\lambda 2$ is favorably not less than 430 nm and not more than 460 nm, and more favorably not less than 447 nm and not more than 455 nm. The difference between the peak wavelength $\lambda 1$ and the peak wavelength $\lambda 2$ is favorably not less than 1 nm and not more than 10 nm, and more favorably not less than 2 nm and not more than 5 nm.

For example, the peak wavelength $\lambda 1$ is determined as the peak wavelength of the light when all of the light-emitting elements 20 located in the outer perimeter region 51 emit light. For example, the peak wavelength of the light when all of the light-emitting elements 20 located in the outer perimeter region 51 emit light can be determined by causing only the light-emitting elements 20 located in the outer perimeter region 51 to emit light. Or, for example, the peak wavelength of the light when all of the light-emitting elements 20 located in the outer perimeter region 51 emit light can be determined by causing all of the light-emitting elements 20 to emit light in a state in which the light-emitting elements 20 located outside the outer perimeter region 51 are shielded. For example, the peak wavelength $\lambda 1$ can be determined as the average value of individual peak wavelengths of light emitted from a plurality of light-emitting elements 20 selected from the light-emitting elements 20 located in the outer perimeter region 51.

For example, the peak wavelength $\lambda 2$ is determined as the peak wavelength of the light when all of the light-emitting elements 20 located in the central region 52 emit light. For example, the peak wavelength of the light when all of the light-emitting elements 20 located in the central region 52 emit light can be determined by causing only the light-emitting elements located in the central region 52 to emit light. The peak wavelength of the light-emitting elements 20 within a predetermined area of the central region 52 determined by causing only the light-emitting elements 20 located within the predetermined area to emit light can be considered as the peak wavelength $\lambda 2$. Alternatively, for example, the peak wavelength of the light when all of the light-emitting elements 20 located in the central region 52 emit light can be determined by causing all of the light-emitting elements 20 to emit light in a state in which the light-emitting elements 20 located outside the central region 52 are shielded. The peak wavelength of the light-emitting elements 20 within a predetermined area of the central region 52 determined by shielding the light-emitting elements 20 located outside the predetermined area can be considered as the peak wavelength $\lambda 2$. For example, the peak wavelength $\lambda 2$ can be determined as the average value of the individual peak wavelengths of the light emitted from a plurality of light-emitting elements 20 selected from the light-emitting elements 20 located in the central region 52.

According to the embodiment, a plurality of types of light-emitting elements having different peak wavelengths can be provided as the second light-emitting elements 22. In such a case, as an example of the second light-emitting elements 22, the second light-emitting element 22 that has a peak wavelength of not less than 447.75 nm and not more than 449.00 nm and the second light-emitting element 22 that has a peak wavelength greater than 449.00 nm and not more than 450.25 nm can be arranged alternately.

The planar light-emitting device can have unevenness in emission color when the plurality of light-emitting elements 20 that emit blue light of the same peak wavelength are located in the element placement region including the outer perimeter region 51 and the central region 52. In the central region 52 and the outer perimeter region 51, light that is emitted in a single light-emitting region, in which a corresponding light-emitting element 20 is located at a center thereof, includes light emitted from the corresponding light-emitting element 20 positioned at the center of the single light-emitting region and light emitted in obliquely upward directions from light-emitting elements 20 located in light-emitting regions around the single light-emitting region. That is, the light from each light-emitting region is visually recognized as light that includes the light from the light-emitting elements 20 located around the respective light-emitting region. In the central region 52, light emitted obliquely upward from light-emitting elements 20 located at all sides around a light light-emitting element 20 is added to light emitted upward from the surrounded light-emitting element 20, and these lights pass through the wavelength conversion member 32, so that desired white light is emitted. On the other hand, for a single light-emitting region in the outer perimeter region 51, which is the outermost-perimeter region, no light-emitting element 20 is located at the outer side of the single light-emitting element 20 around the single light-emitting region. That is, the quantity of light-emitting elements 20 located around a single light-emitting region is smaller than that in the central region 52. Accordingly, in the emitted light in the outer perimeter region 51, the ratio of light emitted in oblique directions from the light-emitting elements 20 located around the outer perimeter region 51 is lower than that in the emitted light in the central region 52. Further, light emitted obliquely upward passes through the wavelength conversion member 32 for a distance greater than a distance for which light emitted directly upward passes through the wavelength conversion member 32, and thus has an increased ratio of light of the wavelength-converted color. Therefore, when the planar light-emitting device is viewed from above, the light that is emitted from the outer perimeter region 51 is likely to have a lower ratio of the light of the wavelength-converted color and to appear bluish white compared to the light emitted from the central region 52. Thus, when the plurality of light-emitting elements 20 that emit blue light of the same peak wavelength are located in both the outer perimeter region 51 and the central region 52, unevenness in emission color can occur due to a chromaticity difference between the outer perimeter region 51 and the central region 52.

In contrast, according to the present embodiment, the peak wavelength $\lambda 1$ of the light emitted from the first light-emitting element 21 located in the outer perimeter region 51 is set to be less than the peak wavelength $\lambda 2$ of the light emitted from the second light-emitting element 22 located in the central region 52. The light of the peak wavelength $\lambda 1$ emitted from the first light-emitting element 21 has a lower luminosity factor of blue than that of the light of the peak wavelength $\lambda 2$ emitted from the second light-emitting element 22.

Therefore, with a configuration in which the second light-emitting element 22 emitting light of the peak wavelength $\lambda 2$ is disposed in the central region 52 and the first light-emitting element 21 emitting light of the peak wavelength $\lambda 1$ less than the peak wavelength $\lambda 2$ is disposed in the outer perimeter region 51, the bluish white appearance of light emitted from the outer perimeter region 51 compared to the light emitted from the central region 52 can be reduced. Accordingly, the chromaticity difference between the outer perimeter region 51 and the central region 52 can be reduced, and the unevenness in emission color can be reduced.

Figures 5, 6:
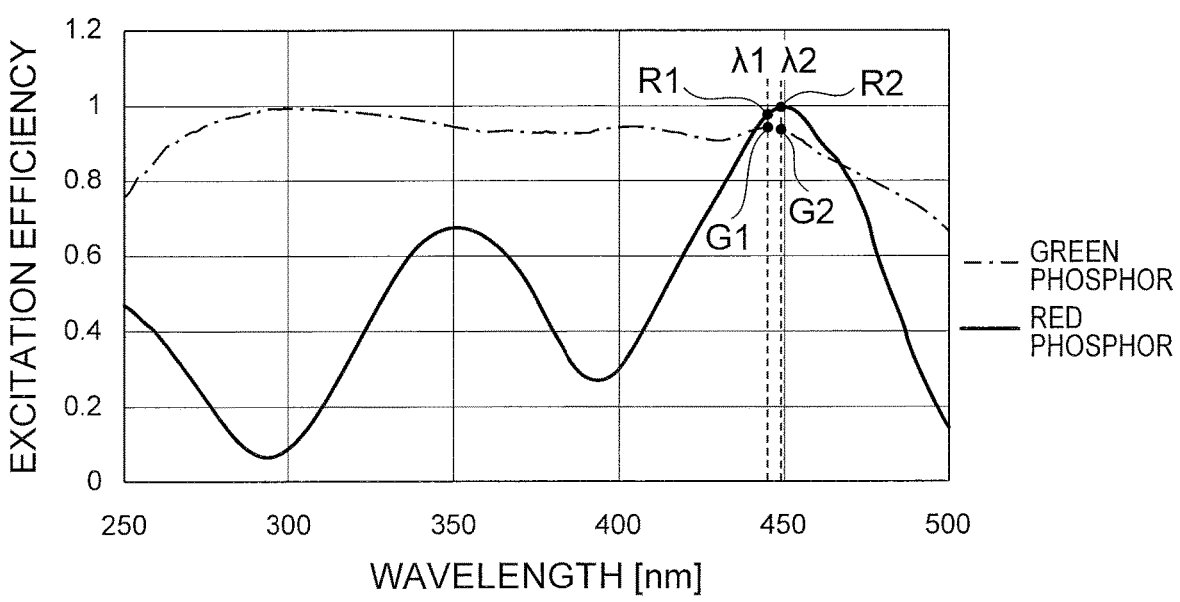
FIG. 5 is a graph showing an example of the excitation spectra of the green phosphor and red phosphor of the planar light-emitting device according to the first embodiment.
FIG. 6 is a plan view illustrating an arrangement of light-emitting elements of a planar light-emitting device according to a second embodiment.

FIG. 5 is a graph showing an example of the excitation spectra of the green phosphor and red phosphor of the planar light-emitting device according to the first embodiment.

The horizontal axis of FIG. 5 is the wavelength (nm). The vertical axis of FIG. 5 is the relative value of the excitation efficiency, in which the maximum value of the excitation efficiency of the red phosphor is set to 1.

In the example, the green phosphor was $\beta$-sialon, and the red phosphor was KSF. In FIG. 5, the excitation spectrum of the green phosphor ($\beta$-sialon) is shown by a single dot-dash line; and the excitation spectrum of the red phosphor (KSF) is shown by a solid line. In the example, the peak wavelength $\lambda 1$ of the light emitted from the first light-emitting element 21 was 445 nm, and the peak wavelength $\lambda 2$ of the light emitted from the second light-emitting element 22 was 449 nm.

In the example as shown in FIG. 5, an excitation efficiency G1 of the green phosphor for the peak wavelength $\lambda 1$ was greater than an excitation efficiency G2 of the green phosphor for the peak wavelength $\lambda 2$. On the other hand, in the example, an excitation efficiency R1 of the red phosphor for the peak wavelength $\lambda 1$ was less than an excitation efficiency R2 of the red phosphor for the peak wavelength $\lambda 2$.

Thus, while there is a tendency for the ratio of the light of the wavelength-converted color to be less for the light emitted from the outer perimeter region 51 than for the light emitted from the central region 52, the green light that is wavelength-converted in the outer perimeter region 51 can be compensated by using such a green phosphor that has the excitation efficiency G1 for the peak wavelength λ1 greater than its excitation efficiency G2 for the peak wavelength λ2. Accordingly, the chromaticity difference between the outer perimeter region 51 and the central region 52 can be reduced, and the unevenness in emission color can be reduced.

Green light has a greater effect on the luminosity factor than red light. Therefore, even though the excitation efficiency R1 for the peak wavelength λ1 is less than the excitation efficiency R2 for the peak wavelength λ2 in the example, the excitation efficiency G1 for the peak wavelength λ1 is greater than the excitation efficiency G2 for the peak wavelength λ2, which allows for reducing the chromaticity difference between the outer perimeter region 51 and the central region 52, so that the unevenness in emission color can be reduced.

To reduce the chromaticity difference between the outer perimeter region 51 and the central region 52 and further reduce the unevenness in emission color, it is favorable to use a combination of a green phosphor that has the excitation efficiency G1 for the peak wavelength λ1 greater than its excitation efficiency G2 for the peak wavelength λ2 and a red phosphor that has the excitation efficiency R1 for the peak wavelength λ1 greater than its excitation efficiency R2 for the peak wavelength λ2. Also, it is favorable to select a combination of the peak wavelength λ1 and the peak wavelength λ2 so that the excitation efficiency G1 of the green phosphor for the peak wavelength λ1 is greater than the excitation efficiency G2 for the peak wavelength λ2, and the excitation efficiency R1 of the red phosphor for the peak wavelength λ1 is greater than the excitation efficiency R2 for the peak wavelength λ2.

Second Embodiment

FIG. 6 is a plan view illustrating an arrangement of light-emitting elements of a planar light-emitting device according to a second embodiment.

In a planar light-emitting device 1A according to the second embodiment as shown in FIG. 6, the element placement region includes the outer perimeter region 51, the central region 52, and an intermediate region 53; and the plurality of light-emitting elements 20 are located in each of these regions. Among these regions, the intermediate region 53 is positioned between the outer perimeter region 51 and the central region 52. The intermediate region 53 is a region located inward of the outer perimeter region 51 and outward of the central region 52. In FIG. 6, the outer perimeter region 51 is shown by dark cross hatching; and the intermediate region 53 is shown by light cross hatching. The intermediate region 53 is positioned inward of the outer perimeter region 51 in a plan view. The intermediate region 53 is positioned outward of the central region 52 in a plan view. For example, the intermediate region 53 is next to the outer perimeter region 51. For example, the intermediate region 53 is next to the central region 52.

In addition to the first light-emitting element 21 and the second light-emitting element 22, the plurality of light-emitting elements 20 further include a third light-emitting element 23. In FIG. 6, the first light-emitting element 21 is indicated by "A", the second light-emitting element 22 is indicated by "B", and the third light-emitting element 23 is indicated by "C". The first light-emitting element 21 is located in the outer perimeter region 51. The second light-emitting element 22 is located in the central region 52. The third light-emitting element 23 is located in the intermediate region 53. The third light-emitting element 23 can be referred to as an intermediate light-emitting element.

The first light-emitting element 21 emits light having the peak wavelength λ1. The second light-emitting element 22 emits light having the peak wavelength λ2. The peak wavelength λ1 of the light emitted from the first light-emitting element 21 is less than the peak wavelength λ2 of the light emitted from the second light-emitting element 22. The first light-emitting element 21 and the second light-emitting element 22 are substantially the same as the first light-emitting element 21 and the second light-emitting element 22 described in the first embodiment, and detailed description thereof will therefore be omitted.

The third light-emitting element 23 emits light having a peak wavelength λ3. The peak wavelength λ3 is, for example, greater than the peak wavelength λ1 of the light emitted from the first light-emitting element 21 and less than the peak wavelength λ2 of the light emitted from the second light-emitting element 22. The peak wavelength λ3 is favorably not less than 430 nm and not more than 460 nm, and more favorably not less than 445 nm and not more than 449 nm. The difference between the peak wavelength λ1 and the peak wavelength λ3 is favorably not less than 1 nm and not more than 5 nm. The difference between the peak wavelength λ2 and the peak wavelength λ3 is favorably not less than 1 nm and not more than nm.

For example, the peak wavelength λ3 is determined as the peak wavelength of the light when all of the light-emitting elements 20 located in the intermediate region 53 emit light. For example, the peak wavelength of the light when all of the light-emitting elements 20 located in the intermediate region 53 emit light can be determined by causing only the light-emitting elements 20 located in the intermediate region 53 to emit light. Alternatively, for example, the peak wavelength of the light when all of the light-emitting elements 20 located in the intermediate region 53 emit light can be determined by causing all of the light-emitting elements 20 to emit light in a state in which the light-emitting elements 20 located in the regions other than the intermediate region 53 are shielded. For example, the peak wavelength λ3 can be determined as the average value of the individual peak wavelengths of the light emitted from a plurality of light-emitting elements 20 selected from the light-emitting elements 20 located in the intermediate region 53.

In the example as well, with the structure in which the second light-emitting element 22 emitting light of the peak wavelength λ2 is disposed in the central region 52 and the first light-emitting element 21 emitting light of the peak wavelength λ1 that is less than the peak wavelength λ2 is disposed in the outer perimeter region 51, the bluish white appearance of the light emitted from the outer perimeter region 51 compared to the light emitted from the central region 52 can be reduced. Accordingly, the chromaticity difference between the outer perimeter region 51 and the central region 52 can be reduced, and thus the unevenness in emission color can be reduced.

Further, with a structure in which the third light-emitting element 23 that emits light having the peak wavelength λ3 greater than the peak wavelength λ1 of the light emitted from the first light-emitting element 21 and less than the peak wavelength λ2 of the light emitted from the second light-emitting element 22 is disposed in the intermediate region 53 between the outer perimeter region 51 and the central region 52, the peak wavelength can be reduced gradually between the outer perimeter region 51 and the central region 52.

The third light-emitting element 23 that emits light having the peak wavelength $\lambda 3$ that is equal to the peak wavelength $\lambda 1$ of the light emitted from the first light-emitting element 21 can be provided in the intermediate region 53 positioned between the outer perimeter region 51 and the central region 52.

Third Embodiment

Figure 7:
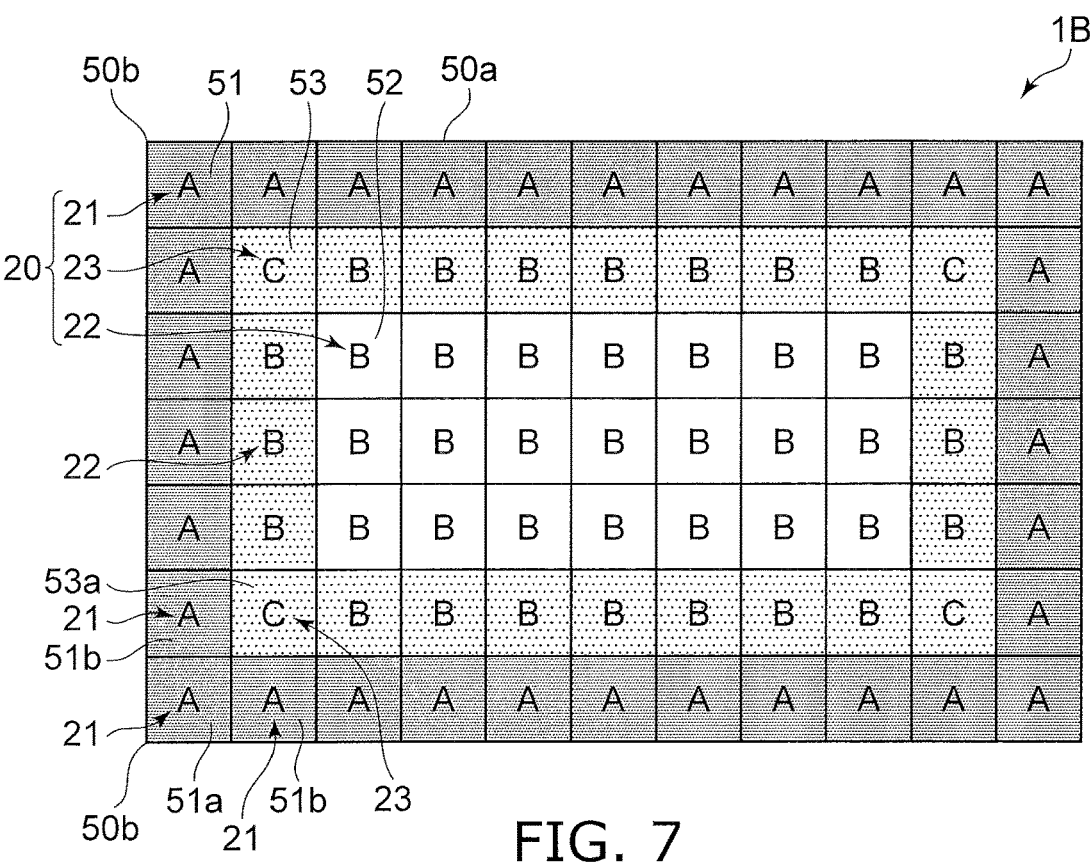
FIG. 7 is a plan view illustrating an arrangement of light-emitting elements of a planar light-emitting device according to a third embodiment.

FIG. 7 is a plan view illustrating an arrangement of light-emitting elements of a planar light-emitting device according to a third embodiment.

In the planar light-emitting device 18 according to the third embodiment as shown in FIG. 7, the outer perimeter region 51 includes a first part 51a and a second part 51b. The first part 51a includes the corner 50b. The second part 51b is next to the first part 51a. The intermediate region 53 includes a third part 53a. The third part 53a is next to the first part 51a. The first part 51a, the second part 51b, and the third part 53a are included in a region around the corner 50b.

In addition to the first light-emitting element 21 and the second light-emitting element 22, the plurality of light-emitting elements 20 include the third light-emitting element 23. In FIG. 7, the first light-emitting element 21 is indicated by "A", the second light-emitting element 22 is indicated by "B", and the third light-emitting element 23 is indicated by "C". The first light-emitting element 21 is located in the outer perimeter region 51. The second light-emitting element 22 is located in the central region 52 and the intermediate region 53. The third light-emitting element 23 is located in the intermediate region 53.

The first light-emitting element 21 emits light having the peak wavelength $\lambda 1$. The second light-emitting element 22 emits light having the peak wavelength $\lambda 2$. The third light-emitting element 23 emits light having the peak wavelength $\lambda 3$. The peak wavelength $\lambda 1$ of the light emitted from the first light-emitting element 21 is less than the peak wavelength $\lambda 2$ of the light emitted from the second light-emitting element 22. The peak wavelength $\lambda 3$ of the light emitted from the third light-emitting element 23 is, for example, greater than the peak wavelength $\lambda 1$ of the light emitted from the first light-emitting element 21 and less than the peak wavelength $\lambda 2$ of the light emitted from the second light-emitting element 22. The first light-emitting element 21 and the second light-emitting element 22 are substantially the same as the first light-emitting element 21 and the second light-emitting element 22 described in the first embodiment, and their detailed descriptions are therefore omitted. The third light-emitting element 23 is substantially the same as the third light-emitting element 23 described in the second embodiment, and its detailed description is therefore omitted.

It is favorable for the first light-emitting element 21 to be located in at least the first and second parts 51a and 51b of the outer perimeter region 51. In the illustrated example, the first light-emitting element 21 is located in the entire region of the outer perimeter region 51, including the first and second parts 51a and 51b.

It is favorable for the third light-emitting element 23 to be located in at least the third part 53a of the intermediate region 53. In the illustrated example, the third light-emitting element 23 is located in only the third part 53a. The second light-emitting element 22 is located in the parts of the intermediate region 53 other than the third part 53a.

In the example as well, with a structure in which the second light-emitting element 22 emitting light of the peak wavelength $\lambda 2$ is disposed in in the central region 52 and the first light-emitting element 21 emitting light of the peak wavelength $\lambda 1$ that is less than the peak wavelength $\lambda 2$ is disposed in the outer perimeter region 51, the bluish-white appearance of the light emitted from the outer perimeter region 51 compared to the light emitted from the central region 52 can be reduced. Accordingly, the chromaticity difference between the outer perimeter region 51 and the central region 52 can be reduced, and thus the unevenness in emission color can be reduced.

The region around the corner 50b has the smallest intensity of light emitted obliquely upward from the light-emitting elements around the region, and thus is a region at which unevenness in emission color easily occurs. Therefore, the first light-emitting element 21 and the third light-emitting element 23 are disposed at the region around the corner 50b, which allows for reducing the unevenness in emission color in the region (the first part 51a, the second part 51b, and the third part 53a) around the corner 50b, at which unevenness in emission color easily occurs.

Fourth Embodiment

Figure 8:
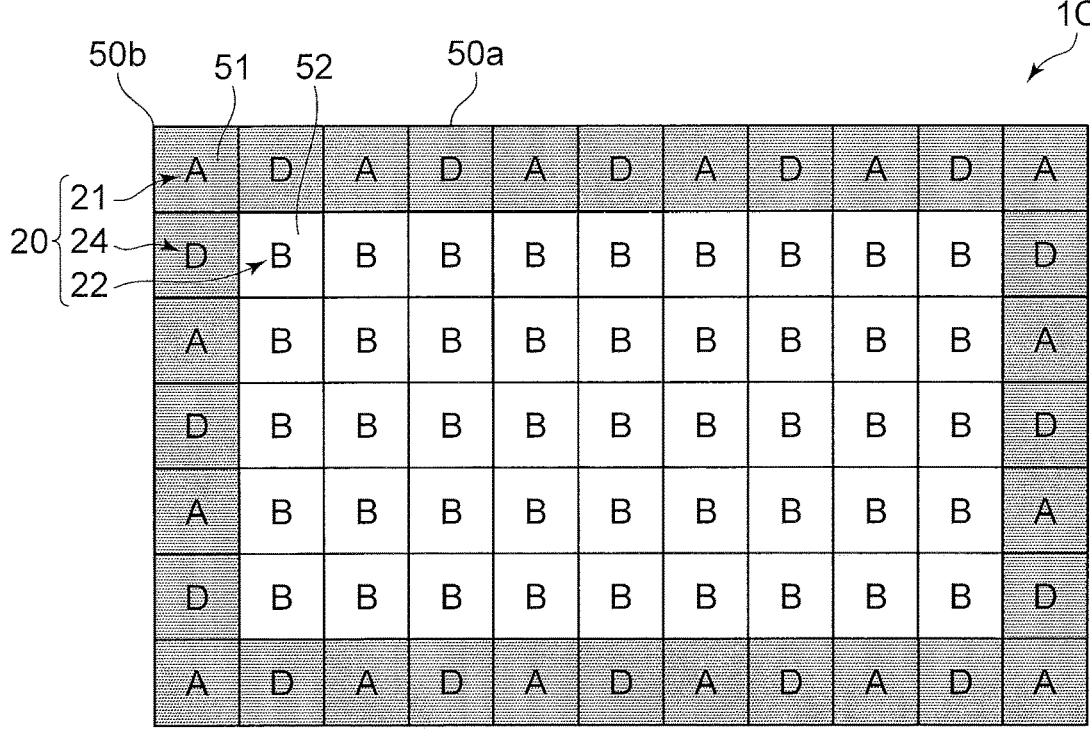
FIG. 8 is a plan view illustrating an arrangement of light-emitting elements of a planar light-emitting device according to a fourth embodiment.

FIG. 8 is a plan view illustrating an arrangement of light-emitting elements of a planar light-emitting device according to a fourth embodiment.

In the planar light-emitting device 1C according to the fourth embodiment as shown in FIG. 8, the plurality of light-emitting elements 20 include an intervening light-emitting element 24 in addition to the first light-emitting element 21 and the second light-emitting element 22. In FIG. 8, the first light-emitting element 21 is indicated by "A", the second light-emitting element 22 is indicated by "B", and the intervening light-emitting element 24 is indicated by "D". The first light-emitting element 21 is located in the outer perimeter region 51. The second light-emitting element 22 is located in the central region 52. The intervening light-emitting element 24 is located in the outer perimeter region 51.

The intervening light-emitting element 24 is positioned between the plurality of first light-emitting elements 21 in the outer perimeter region 51. Also, the first light-emitting element 21 is positioned between adjacent ones of the plurality of intervening light-emitting elements 24 in the outer perimeter region 51. In the illustrated example, the first light-emitting element 21 and the intervening light-emitting element 24 are alternately arranged in the outer perimeter region 51. The number of the intervening light-emitting elements 24 positioned between two first light-emitting elements 21 can be one, two, or more. The number of the first light-emitting elements 21 positioned between two intervening light-emitting elements 24 can be one, two, or more.

The first light-emitting element 21 emits light having the peak wavelength $\lambda 1$. The second light-emitting element 22 emits light having the peak wavelength $\lambda 2$. The third light-emitting element 23 emits light having the peak wavelength $\lambda 3$. The peak wavelength $\lambda 1$ of the light emitted from the first light-emitting element 21 is less than the peak wavelength $\lambda 2$ of the light emitted from the second light-emitting element 22. The first light-emitting element 21 and the second light-emitting element 22 are substantially the same as the first light-emitting element 21 and the second light-emitting element 22 described in the first embodiment, and their detailed descriptions are therefore omitted.

The intervening light-emitting element 24 emits light having a peak wavelength $\lambda 4$. The peak wavelength $\lambda 4$ is, for example, equal to the peak wavelength $\lambda 2$ of the light emitted from the second light-emitting element 22 or less than the peak wavelength $\lambda 2$ of the light emitted from the second light-emitting element 22. The peak wavelength $\lambda 4$ is greater than the peak wavelength $\lambda 1$ of the light emitted from the first light-emitting element 21. The peak wavelength $\lambda 4$ is favorably not less than 430 nm and not more than 460 nm, and more favorably not less than 445 nm and not more than 449 nm. The difference between the peak wavelength $\lambda 1$ and the peak wavelength $\lambda 4$ is favorably not less than 1 nm and not more than 5 nm. The difference between the peak wavelength $\lambda 2$ and the peak wavelength $\lambda 4$ is favorably not less than 1 nm and not more than nm.

For example, the peak wavelength $\lambda 4$ is determined as the peak wavelength of the light when the light-emitting elements 20 located in the outer perimeter region 51 are caused to individually emit light. For example, the peak wavelength of the light when the light-emitting elements 20 located in the outer perimeter region 51 are caused to individually emit light can be measured in a state in which the light-emitting elements 20 are located in the outer perimeter region 51, or in a state in which the light-emitting elements 20 are removed from the outer perimeter region 51. For example, the light-emitting element 20 that has a longer peak wavelength than the peak wavelength $\lambda 1$ can be considered as the intervening light-emitting element 24.

Embodiments can include the following configurations.
(Configuration 1)
A planar light-emitting device, comprising:
a plurality of light-emitting elements arranged at same intervals in a planar configuration, the plurality of light-emitting elements configured to emit blue light; and
a wavelength conversion member located above the plurality of light-emitting elements, the wavelength conversion member containing a phosphor that emits light when being excited by light emitted from the plurality of light-emitting elements,
the plurality of light-emitting elements including
a first light-emitting element located in an outer perimeter region in a plan view, and
a second light-emitting element located in a central region in the plan view, the central region being positioned inward of the outer perimeter region in the plan view,
a peak wavelength of light emitted from the first light-emitting element being less than a peak wavelength of light emitted from the second light-emitting element.
(Configuration 2)
The device according to configuration 1, wherein
the plurality of light-emitting elements further includes a third light-emitting element located in an intermediate region positioned between the outer perimeter region and the central region in the plan view, and
a peak wavelength of light emitted from the third light-emitting element is greater than the peak wavelength of the light emitted from the first light-emitting element and less than the peak wavelength of the light emitted from the second light-emitting element.
(Configuration 3)
The device according to configuration 2, wherein
the plurality of light-emitting elements is arranged in a rectangular configuration in the plan view,
the outer perimeter region includes:
a first part including a corner of the rectangular configuration; and
a second part next to the first part, the intermediate region includes a third part next to the first part,
a first-first light-emitting element and a second-first light-emitting element are located in the first part and the second part, respectively, and
the third light-emitting element is located in the third part.
(Configuration 4)
The device according to any one of configurations 1 to 3, wherein
the plurality of light-emitting elements further includes an intervening light-emitting element located in the outer perimeter region in the plan view,
the intervening light-emitting element is positioned between adjacent ones of a plurality of the first light-emitting elements, and
a peak wavelength of light emitted from the intervening light-emitting element is equal to the peak wavelength of the light emitted from the second light-emitting element or less than the peak wavelength of the light emitted from the second light-emitting element.
(Configuration 5)
The device according to any one of configurations 1 to 4, further comprising:
a substrate at which the plurality of light-emitting elements is disposed; and
a light-transmitting member covering at least one of the plurality of light-emitting elements on the substrate.
(Configuration 6)
The device according to any one of configurations 1 to 5, further comprising:
a substrate at which the plurality of light-emitting elements is disposed; and
a demarcation member defining a plurality of regions each surrounding a respective one of the plurality of light-emitting elements on the substrate,
the demarcation member being light-reflective.
(Configuration 7)
The device according to any one of configurations 1 to 6, wherein
the wavelength conversion member is plate-shaped, and
the wavelength conversion member and the plurality of light-emitting elements are separated from each other.
(Configuration 8)
The device according to any one of configurations 1 to 7, wherein
the phosphor contains:
at least one selected from a group consisting of $\beta$-sialon, chlorosilicate, silicate, BSON, perovskite, and thiogallate; and
at least one selected from a group consisting of KSF, KSAF, MGF, SCASN, CASN, and $\alpha$-sialon.
(Configuration 9)
The device according to any one of configurations 1 to 8, wherein
the peak wavelength of the light emitted from the first light-emitting element and the peak wavelength of the light emitted from the second light-emitting element are not less than 430 nm and not more than 460 nm.
(Configuration 10)
The device according to claim any one of configurations 1 to 9, wherein
a difference between the peak wavelength of the light emitted from the first light-emitting element and the peak wavelength of the light emitted from the second light-emitting element is not less than 1 nm and not more than 10 nm.

Thus, according to certain embodiments, a planar light-emitting device is provided in which unevenness in emission color can be reduced.

The embodiments described above are examples to give a concrete form to the present invention; and the invention is not limited to these embodiments. For example, additions, deletions, or modifications of some of the components or processes in the embodiments described above also are included in the invention. The embodiments described above can be implemented in combination with each other.

The present invention can be used for, for example, lighting devices and light sources for display devices.

What is claimed is:

1. A planar light-emitting device, comprising:
a plurality of light-emitting elements arranged at same intervals in a planar configuration, the plurality of light-emitting elements configured to emit blue light; and
a wavelength conversion member located above the plurality of light-emitting elements, the wavelength conversion member containing a phosphor that emits light when being excited by light emitted from the plurality of light-emitting elements,
the plurality of light-emitting elements including
a first light-emitting element located in an outer perimeter region in a plan view, and
a second light-emitting element located in a central region in the plan view, the central region being positioned inward of the outer perimeter region in the plan view,
a peak wavelength of light emitted from the first light-emitting element being less than a peak wavelength of light emitted from the second light-emitting element, wherein
the plurality of light-emitting elements further includes a third light-emitting element located in an intermediate region positioned between the outer perimeter region and the central region in the plan view,
a peak wavelength of light emitted from the third light-emitting element is greater than the peak wavelength of the light emitted from the first light-emitting element and less than the peak wavelength of the light emitted from the second light-emitting element,
the plurality of light-emitting elements is arranged in a rectangular configuration in the plan view,
the outer perimeter region includes:
a first part including a corner of the rectangular configuration; and
a second part next to the first part,
the intermediate region includes a third part next to the first part,
a first-first light-emitting element and a second-first light-emitting element are located in the first part and the second part, respectively, and
the third light-emitting element is located in the third part, and
another second light-emitting element is located in the intermediate region.

2. The device according to claim 1, wherein
the plurality of light-emitting elements further includes an intervening light-emitting element located in the outer perimeter region in the plan view,
the intervening light-emitting element is positioned between adjacent ones of a plurality of the first light-emitting elements, and
a peak wavelength of light emitted from the intervening light-emitting element is equal to the peak wavelength of the light emitted from the second light-emitting element or less than the peak wavelength of the light emitted from the second light-emitting element.

3. The device according to claim 1, further comprising:
a substrate at which the plurality of light-emitting elements is disposed; and
a light-transmitting member covering at least one of the plurality of light-emitting elements on the substrate.

4. The device according to claim 1, further comprising:
a substrate at which the plurality of light-emitting elements is disposed; and
a demarcation member defining a plurality of regions each surrounding a respective one of the plurality of light-emitting elements on the substrate, the demarcation member being light-reflective.

5. The device according to claim 1, wherein
the wavelength conversion member is plate-shaped, and
the wavelength conversion member and the plurality of light-emitting elements are separated from each other.

6. The device according to claim 1, wherein
the phosphor contains:
at least one selected from a group consisting of β-sialon, chlorosilicate, silicate, BSON, perovskite, and thiogallate; and
at least one selected from a group consisting of KSF, KSAF, MGF, SCASN, CASN, and β-sialon.

7. The device according to claim 1, wherein
the peak wavelength of the light emitted from the first light-emitting element and the peak wavelength of the light emitted from the second light-emitting element are not less than 430 nm and not more than 460 nm.

8. The device according to claim 7, wherein
a difference between the peak wavelength of the light emitted from the first light-emitting element and the peak wavelength of the light emitted from the second light-emitting element is not less than 1 nm and not more than 10 nm.

9. The device according to claim 2, wherein
the phosphor contains:
at least one selected from a group consisting of β-sialon, chlorosilicate, silicate, BSON, perovskite, and thiogallate; and
at least one selected from a group consisting of KSF, KSAF, MGF, SCASN, CASN, and β-sialon.

10. The device according to claim 4, wherein
the phosphor contains:
at least one selected from a group consisting of β-sialon, chlorosilicate, silicate, BSON, perovskite, and thiogallate; and
at least one selected from a group consisting of KSF, KSAF, MGF, SCASN, CASN, and β-sialon.

11. The device according to claim 2, wherein
the peak wavelength of the light emitted from the first light-emitting element and the peak wavelength of the light emitted from the second light-emitting element are not less than 430 nm and not more than 460 nm.

12. The device according to claim 4, wherein
the peak wavelength of the light emitted from the first light-emitting element and the peak wavelength of the light emitted from the second light-emitting element are not less than 430 nm and not more than 460 nm.

13. The device according to claim 6, wherein
the peak wavelength of the light emitted from the first light-emitting element and the peak wavelength of the light emitted from the second light-emitting element are not less than 430 nm and not more than 460 nm.

14. The device according to claim 9, wherein
the peak wavelength of the light emitted from the first
light-emitting element and the peak wavelength of the
light emitted from the second light-emitting element
are not less than 430 nm and not more than 460 nm.

15. The device according to claim 10, wherein
the peak wavelength of the light emitted from the first
light-emitting element and the peak wavelength of the
light emitted from the second light-emitting element
are not less than 430 nm and not more than 460 nm.

16. The device according to claim 1, wherein
the third light-emitting element is located between the
another second light-emitting element and a further
second light-emitting element in the intermediate
region.

* * * * *